United States Patent [19]

Toyoda et al.

[11] Patent Number: 4,536,860
[45] Date of Patent: Aug. 20, 1985

[54] RANDOM ACCESS MEMORY DEVICE

[75] Inventors: Kazuhiro Toyoda, Yokohama; Haruo Shimada, Hino, both of Japan

[73] Assignee: Fujitsu Limited, Kawasaki, Japan

[21] Appl. No.: 568,952

[22] Filed: Jan. 6, 1984

Related U.S. Application Data

[63] Continuation of Ser. No. 249,695, Mar. 31, 1981, abandoned.

[30] Foreign Application Priority Data

Apr. 1, 1980 [JP] Japan .................................. 55-42489

[51] Int. Cl.³ .............................................. G11C 7/00
[52] U.S. Cl. ..................................... 365/190; 365/155
[58] Field of Search ............... 365/154, 155, 190, 226, 365/227, 189

[56] References Cited

U.S. PATENT DOCUMENTS 3,986,178 10/1976 McElroy et al. .................... 365/190
4,348,747 9/1982 Takahashi .......................... 365/190

FOREIGN PATENT DOCUMENTS 50-139635 11/1975 Japan .

Primary Examiner—Joseph A. Popek
Attorney, Agent, or Firm—Staas & Halsey

[57] ABSTRACT

The random access memory device of the present invention provides the memory cell array arranged in the form of a matrix. The plurality of memory cells have cross-connected flip-flop circuits. Word driver transistors are provided corresponding to a plurality of word lines, wherein the collector is connected to a high power supply voltage while the emitter is connected to the word line. Moreover, the base of the word driver transistor is connected respectively in common to a selected word line level switching circuit via diodes. The selected word line level switching circuit supplies a current during the write operation to the common connecting point of diodes and forms a current switch together with the diodes. Thus, the voltage of a selected word line is lower than that during the read operation. The present invention provides a random access memory device which has a simplified structure, consumes less current and assures a high speed read operation.

16 Claims, 15 Drawing Figures

RANDOM ACCESS MEMORY DEVICE

This application is a continuation of application Ser. No. 249,695, filed Mar. 31, 1981, now abandoned.

BACKGROUND OF THE INVENTION

1. Field of the Invention

This invention relates to a random access memory comprising a plurality of memory cells each of which has a flip-flop circuit where a pair of transistors are cross-connected, particularly to a memory cell driver circuit.

2. Description of the Prior Art

A random access memory device, wherein a plurality of memory cells comprising a flip-flop circuit cross-connecting a pair of bipolar transistors as the basic structure are arranged in the form of a matrix is generally known as a high speed RAM (Random Access Memory). In such a memory cell array having the memory cells in the form of a matrix, a level difference exists between the potentials of a selected word line and a non-selected word line. This level difference has so far been selected from the point of view of acquiring a margin at the time of data writing to the memory cells and therefore this value is excessive for data reading. This situation is explained by referring to FIG. 1 to FIG. 3.

FIG. 1 outlines a memory cell array where the memory cells Moo ... Mno ... Mom ... Mnm are arranged in the form of $(n+1)\times(m+1)$ matrix. Each memory cell has, for example in the case of Moo, a flip-flop circuit where the collector and base of a pair of bipolar transistors Qc1, Qc2 are cross-connected. In FIG. 1, Wo ... Wn are word lines, H0 ... Hn are hold lines, Bo ... Bm, $\overline{B}$o ... $\overline{B}$m are bit lines. The word lines W0 .. Wn are selected by the word drivers WD0 ... WDn, while the bit line pairs (B0,$\overline{B}$0) ... (Bm,$\overline{B}$m) are selected by the bit drivers BD0 ... BDm. The bit drivers BD0 ... BDm form the current switch circuits in combination with the constant current source $I_{BS}$. A current is applied to only a single pair of bit lines as selected by the Y selection signal $V_{Y0}$... $V_{Ym}$. Only a pair of bit lines is selected. It is also possible to apply a current to all lines. The word drivers WD0 ... WDn selected by the X selection signals $V_{X0}$... $V_{Xn}$ make only one word line a "H" (High) level and maintain the remaining word lines at a "L" (Low) level. SA is the sense amplifier which forms the detecting system for the contents stored in the memory cell in combination with the transistors $(Q_{S10},Q_{S20})$ ... $(Q_{S1m},Q_{S2m})$ of the the bit line pairs (B0, $\overline{B}$0) ... (Bm, $\overline{B}$m). WA is a write amplifier which generates an output $V_D \neq \overline{V}_D$ in accordance with an input Din when the write signal WE is "L", namely during writing, while an output $V_D = \overline{V}_D$ when the write signal WE is "H", namely during reading.

Explained below with reference to FIG. 2 is the memory array operation with a pair of bit lines B0, $\overline{B}$0 selected and the word line $W_s$ selected (the selected line is given the subscript s, while the non-selected one is given the subscript N).

FIG. 2 shows a part of FIG. 1, while FIG. 3 shows the potentials of FIG. 2. Namely, when the X selection signal $V_{xs}$ is "H", the potential $V_{ws}$ of the word line $W_s$ of selected memory cell $M_{s0}$ is kept high by the word driver $WD_s$. At this time, since the other X selection signal $V_{XN}$ is a "L", the potential $V_{WN}$ of the remaining word lines $W_N$ is kept low by means of the word driver $WD_N$.

The read operation and write operation for the memory cell $M_{s0}$ under such condition will be explained by referring to FIG. 3.

The memory cell $M_{s0}$ (similar to $M_{N0}$) is the emitter detection type cell consisting of two load resistances $R_L$, Schottky barrier diodes SBD and multi-emitter transistors. The transistors $Q_{H1}$ to $Q_{H4}$ connected to the hold lines $H_S$, $H_N$ of the multi-emitter transistors, are the memory holding transistors, while the transistors $Q_{c1}$ to $Q_{c4}$ connected to the bit lines $B_1$, $\overline{B}_1$, are the driver transistors.

When the transistor $Q_{H1}$ of memory cell $M_{s0}$ is ON, $Q_{H2}$ is OFF, and before selection, the relation $V_{BS} > V_{CS}$ is exists between the base voltage $V_{BS}$ of the transistor $Q_{c1}$ and collector voltage $V_{CS}$ at the time $Q_{c1}$ is selected. Here, a voltage difference $(V_{BS} - V_{CS})$ is considered as $V_{BCS}$. Namely, the base voltage $V_{BS}$ is obtained by subtracting a value of voltage drop (this is very small) expressed as the subtraction of the product of the load resistance $R_L$ of $Q_{c2}$ and a base current of $Q_{c1}$ from the word line voltage $V_{WS}$, while the collector voltage $V_{CS}$ is obtained by subtracting a voltage drop in the forward direction $(V_{BE})$ of SBD from $V_{cc}$ because the collector current of $Q_{c1}$ is sufficiently high and therefore the diode SBD is ON. Thus, as shown in FIG. 3, $V_{CS}$ is kept low.

The read operation under this condition will be explained below. First, the write amplifier generates output $V_D$, $\overline{V}_D$ in accordance with the relation, $V_{CS} < V_D = \overline{V}_D < V_{BS}$. Since the transistors $Q_{c1}$ and $Q_{s1}$, $Q_{c2}$ and $Q_{s2}$ respectively form the current switch, the transistor $Q_{c1}$ is ON, while $Q_{s1}$ is OFF and the current $I_B$ of bit line $B_1$ is supplied from the transistor $Q_{c1}$. Simultaneously, since $V_{CS} < V_D$, the transistor $Q_{s2}$ is ON, while $Q_{c2}$ is OFF. Thus the current $\bar{I}_B$ of the bit line $\overline{B}_1$ is supplied from the transistor $Q_{s2}$. For this reason, the currents viewed from the sense amplifier SA are as follow. $I_D=0$, $\bar{I}_D=\bar{I}_B$. The information of memory cell $M_{S0}$ can be read using the difference between these currents.

Next, the write operation will be explained with the condition of memory cell $M_{S0}$ inverted by the write operation. For this purpose, first of all, it is necessary to lower the $\overline{V}_D$ below collector voltage $V_{CS}$ by about 200 mV or more, in order to turn $Q_{c1}$ to OFF from ON. When $\overline{V}_D$ is lowered and it becomes equal to $V_{CS}$ $(\overline{V}_D = V_{CS})$, the current $\bar{I}_B$ of the bit line $\overline{B}_1$ flows equally from both transistors $Q_{c2}$ and $Q_{s2}$, and moreover when $\overline{V}_D$ is further lowered $(\overline{V}_D < V_{CS})$, the current $\bar{I}_b$ flows from the transistor $Q_{c2}$ and thereby the transistor $Q_{c2}$ is ON, while $Q_{s2}$ is OFF. As a result, $V_{BS}$ is low and the flip-flop is inverted (not indicated in FIG. 3). When $V_{BS} < V_D$, even if the $V_D$ remains at a potential equal to that in read operation, the transistor $Q_{s1}$ is ON, while transistor $Q_{c1}$ is OFF. In such a conventional memory, a level of $V_D$ is boosted generally as indicated in FIG. 3 in order to realize the speed-up of the write operation. Therefore, turning the transistors OFF is performed more quickly.

The problems of the abovementioned write and read operations will be explained. At the time of the write operation, the potential $V_{WN}$ of the non-selected word line $W_N$ must be such that $V_{WN} < \overline{V}_D < V_{CS}$. Namely, when the transistor $Q_{H4}$ of the non-selected memory cell $M_{N0}$ is in the ON state during the write operation, the base voltage $V_{BN}$ is almost equal to $V_{WN}$. When the relation $V_{WN} > \overline{V}_D$ is established with $\overline{V}_D$ lowered for the write operation, the transistor $Q_{c4}$ turns ON and the current $\bar{I}_B$ of the bit line $\bar{B}_1$ is supplied from said transistor $Q_{c4}$. However, the transistor $Q_{c2}$ cannot turns ON sufficiently or it requires excessive long period until it turns ON. In order to avoid such disadvantage, the relation $V_{CS} > \bar{V}_D > V_{WN} \approx V_{BN}$ is necessary.

On the other hand, during the read operation, the potential $V_{WN}$ of the non-selected word line must be lower than $V_{WS}$ by a constant value, but is not required to be as low as that in the write operation. Namely, it is sufficient if it is a little lower than $V_D = \bar{V}_D$. In other words, if $V_{WN} = V_{BN} = V_D = \bar{V}_D$ during the read operation, the current $\bar{I}_B$ of the bit line $\bar{B}_1$ is supplied from both the transistor $Q_{s2}$ and $Q_{c4}$. Thereby, a difference of currents $(\bar{I}_D - I_D)$ at the sense amplifier SA is reduced to a half, and thus it becomes difficult to read out the content of the cell $M_{S0}$. Such a disadvantage can be avoided by lowering the potential $V_{WN}$ of the non-selected word line WN than the value $V_D = \bar{V}_D$.

However, since the word line potential of the non-selected cell or the word line potential of the selected cell is conventionally constant anytime during the read and write operations, a difference in voltages between the selected word line voltages $V_{WS}$ and non-selected word line voltage $V_{WN}$ during read operation has been excessively high. This means that the selected word line voltage rises drastically during the change over to selection from the non-selection condition, namely in the transient condition to the read operation. Since it is necessary to charge the stray capacitance of the word lines to raise the word line voltage, a longer period is required for raising the word line voltage. Moreover, such problem has brought about the disadvantage that the read operation speed is lowered.

Such disadvantage can be eliminated by changing the voltage level difference between the selected word line and non-selected word line for the read and write operations. Moreover, the same effect can be obtained by changing the single selected word line level for the read and write operations.

This example of changing the selected word line level will be explained by referring to the schematic diagram of FIG. 4. The circuit shown in FIG. 4 illustrates the decoders $DEC_0$ to $DEC_n$ and word drivers $WD_0$ to $WD_n$. In regard to the decoders $DEC_0$ to $DEC_n$, only a part is shown. In the decoders $DEC_0$ to $DEC_n$, the transistors $(T_{10}, T_{20}, T_{30})$ to $(T_{1n}, T_{2n}, T_{3n})$ respectively form the current switches for $I_{xw}$, while the transistors $(T_{40}, T_{50})$ to $(T_{4n}, T_{5n})$ respectively form the current for $I_x$. Only one of the decoder signals $S_0$ to $S_n$ is a low (L) level and the transistors $(T_{10}, T_{50})$ are OFF, if $S_0$ is the L level. Thus, one of the selection signal voltages $V_{X0}$ to $V_{Xn}$ becomes a high, H, level. Thereby, one of the word lines $WL_0$ to $WL_n$ becomes H level and is selected. At this time, all of the remaining signals among $S_0$ to $S_n$ are at a H level, turning ON the relevant transistors $(T_{10}, T_{50})$ and resultingly all of the remaining selection signal voltages $V_{X0}$ to $V_{Xn}$ are a L level. Thus, the relevant word line is a L level.

The level of a word line $WL_0$ to $WL_n$ when selected is higher than that at the time of non-selection. But the select level at the time of the write operation is higher than that at the time of the read operation as shown in FIG. 5. In other words, the write control signal WE is a H during the read operation or a L during the write operation. During the read operation, at the current switches $T_{10}, T_{20}, T_{30}$ (FIG. 4) which select the word line, for example, $WL_0$, the transistor $T_{20}$ is ON. At the current switch comprising the transistors $T_{40}, T_{50}$, the transistor $T_{40}$ is ON and a current of the current source $I_x$ flows through the transistor $T_{40}$. On the other hand, when the transistor $T_{20}$ is ON, the current $I_{XW}$ flows through the load resistance $R_X$. Therefore, the selection signal voltage $V_{X0}$ is lowered to $(V_{CC} - R_X I_{XW})$ as indicated in FIG. 5. This voltage is higher than the level $\{V_{CC} - R_X(I_X + I_{XW})\}$ of the non-selection condition, but is lower than the level $V_{CC}$ in the selecting condition.

Meanwhile, since $S_0 = L$, WE $= L$ during the write operation, the transistors $T_{30}, T_{40}$ are ON, while $T_{10}, T_{20}, T_{50}$ are OFF. Therefore, the currents $I_x, I_{XW}$ do not flow into the resistor $R_X$. Thereby, the selection signal voltage $V_{X0}$ becomes the highest power supply voltage $V_{CC}$. At the time of non selection, $S_0$ is a H level (similar to the other non-selection word), the transistors $T_{10}, T_{50}$ are ON and the currents $I_x, I_{XW}$ flow through the resistance $R_X$. As a result, the selection signal voltage $V_{X0}$ is the lowest level shown in FIG. 5.

By the aforementioned operation, the potential of the word line during the write operation can be made larger than that during the read operation. However, the circuit shown in FIG. 4 requires the current sources $I_X, I_{XW}$ for each of the decoders $DEC_0$ to $DEC_n$ which are provided to the word drivers $WD_0$ to $WD_n$. Therefore there is a disadvantage in that power consumption is large. Furthermore, the multi-emitter type transistors are used and many elements are also used in each of the decoders $DEC_0$ to $DEC_n$, so that, the structure is complicated.

SUMMARY OF THE INVENTION

It is an object of the present invention to provide a RAM device wherein the potential of the word line is changed respectively for the write and read operations, thereby ensuring a high speed read operation and an accurate write operation.

It is another object of the present invention to provide a memory array driver circuit where the non-selected word line voltage is kept at a constant value for read and write operations and the selected word line voltage during the write operation is higher than that during the read operation.

It a further object of the present invention to provide the driver circuit having a small number of elements, having a simple circuit structure and consuming less power consumption.

The present invention relates to a random access memory device comprising;
- a memory cell array arranged in the form of matrix, a plurality of memory cells having the flip-flop circuit where with cross-connected transistors;
- a plurality of word lines connected to said memory cells;
- word drivers which are provided respectively corresponding to the word lines and make the selected word line voltage higher than the non-selected word line voltage by means of a selection signal which is an input signal, and word decoders which are provided respectively corresponding to the word drivers and supply the selection signal, which is higher than that supplied to the non-selected word drivers, to the selected word drivers;
- a selected word line level switching circuit which makes the selection signal of the selected word drivers in the read operation, the switching circuit lower than that in the write operation is provided in common with the input terminal of the word driver via the switching portion of the drivers and whereby the potential of the selected word lines in the read operation is lower than that in the write operation.

DESCRIPTION OF THE REFERRED EMBODIMENT

Figure 1:
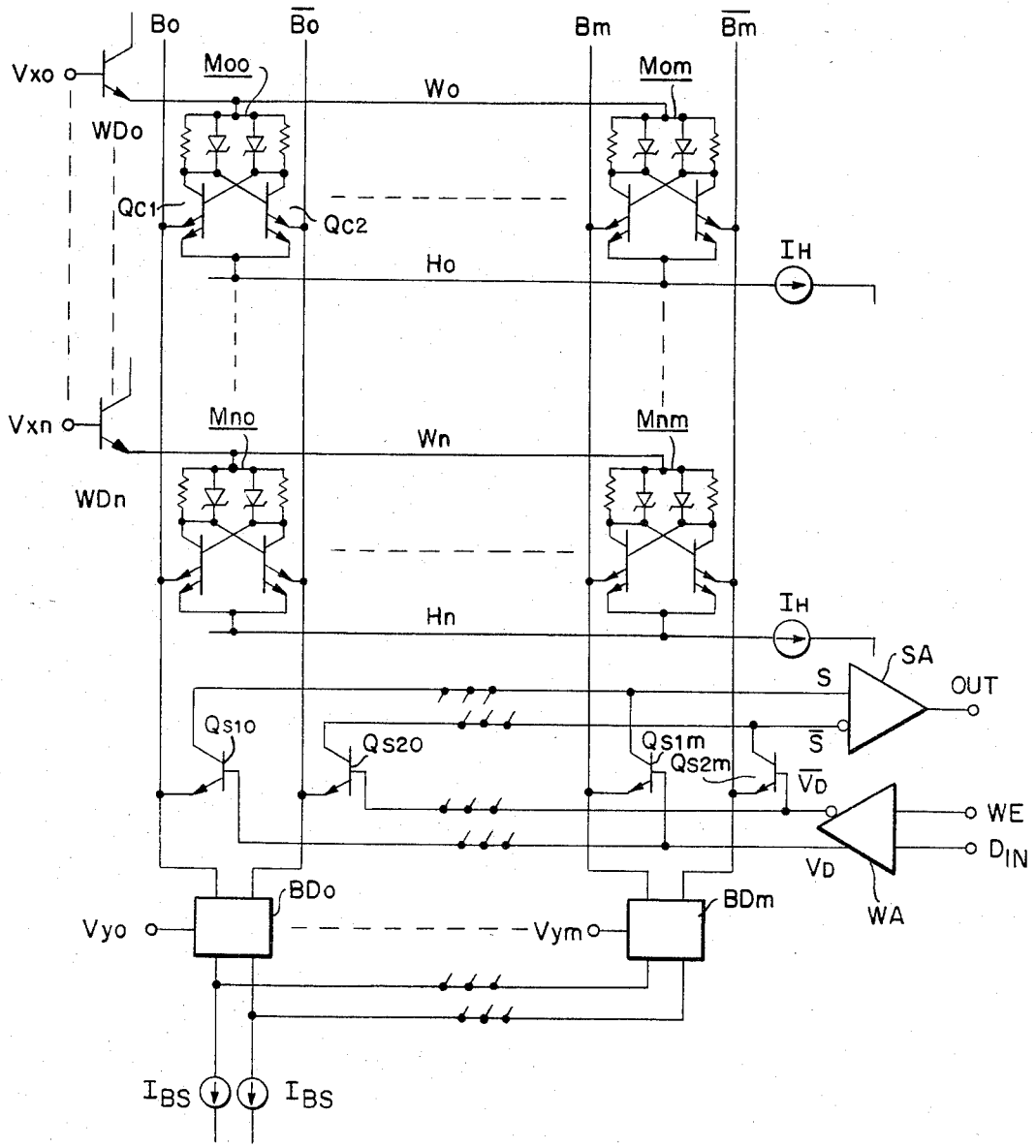
FIG. 1 is a schematic diagram of a static type RAM.
Figure 2:
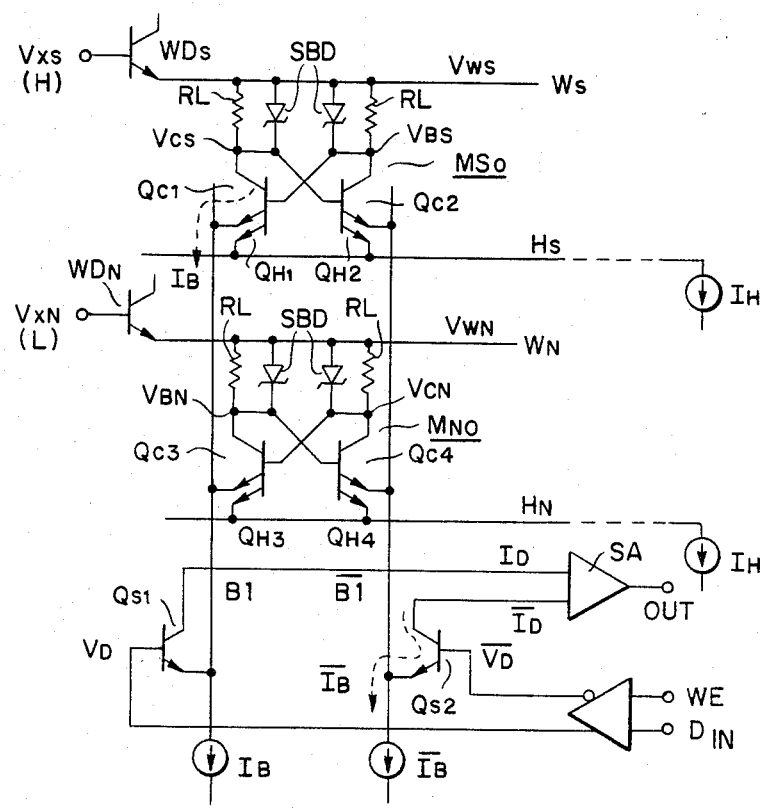
FIG. 2 is a schematic diagram indicating in detail a part of the cell array of the RAM of FIG. 1
Figure 3:
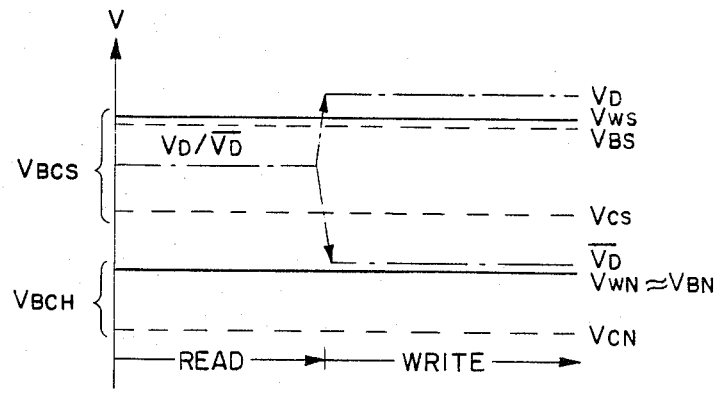
FIG. 3 is a graph of the relation of voltages at terminals in the circuit of FIG. 2.
Figure 6:
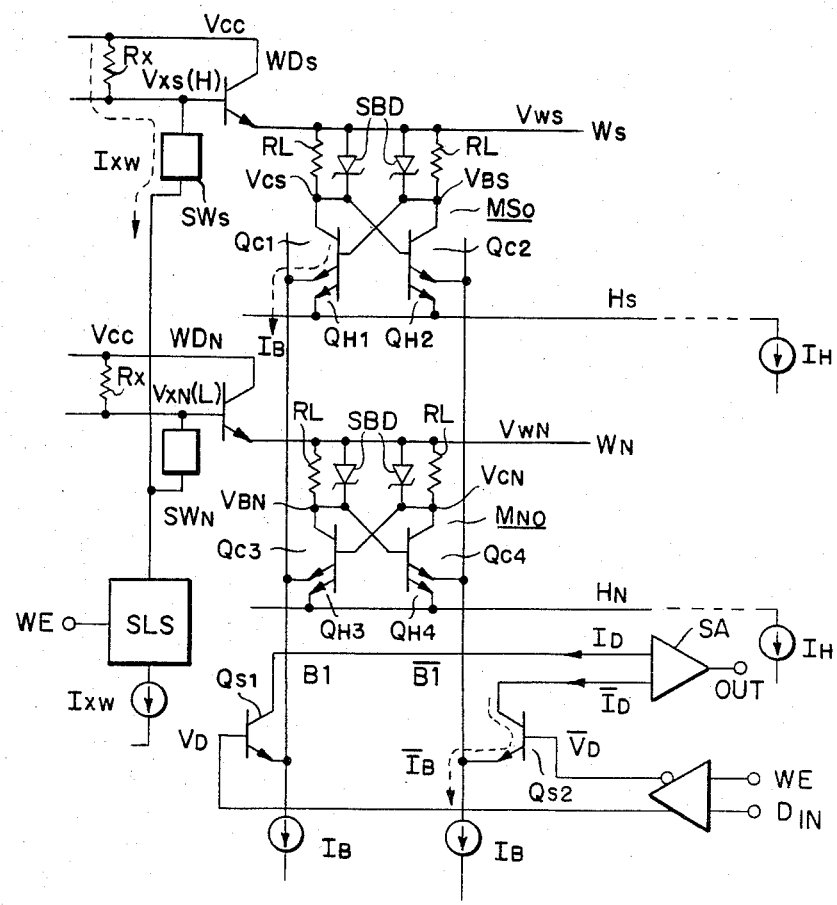
FIG. 6 is a schematic diagram of the present invention.
Figure 7:
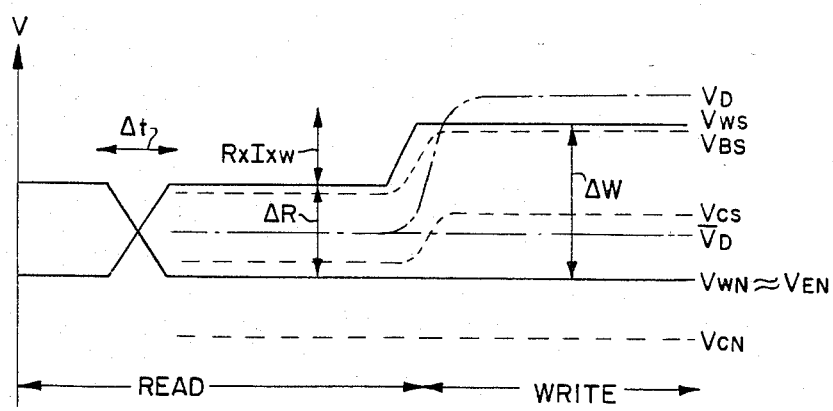
FIG. 7 is a graph of the operating voltage waveforms of terminals of circuit in FIG. 6.

FIG. 6 is a schematic diagram for explaining the concept of the present invention. The operation of this circuit is explained by referring to the operating voltage waveforms of FIG. 7. The portions of FIG. 6 corresponding to those of FIG. 2 mentioned above are given the same reference symbol. The conditions of the information held by the selected memory cell $M_{S0}$ and non-selected memory cell $M_{N0}$ are the same as that of FIG. 2.

According to FIG. 6, the word drivers $WD_S$ to $WD_N$ corresponding to the word lines $W_S$ to $W_N$ are connected such that the collector is connected to a high voltage power supply $V_{cc}$, while the emitter is connected to the word lines $W_S$ to $W_N$ and the base is the input terminal. To the base, the selection signals $V_{XS}$ to $V_{XN}$ are supplied from the decoder (not illustrated). Therefore, a high voltage selection signal $V_{XS}$ is supplied to the base of the selected word driver $WD_S$ and the word line $W_S$ has a high voltage $V_{WS}$. To the base of other non-selected word drivers $WD_N$, a low voltage selection signal $V_{XN}$ is supplied and thereby the word lines $W_N$ are kept at a low voltage $V_{WN}$.

Moreover, according to FIG. 6, the selection word line level switching circuit SLS is provided in common to the input terminal of the word drivers $WD_S$ to $WD_N$ via the switching parts $SW_S$ to $SW_N$, respectively. The selected word line level switching circuit SLS controls a current $I_{XW}$ from the input terminal of the selected word driver $WD_S$ in the read operation in accordance with the write control signal WE. Namely, the current $I_{XW}$ flows along the route, Power supply $V_{CC}$, through the Load resistance $R_X$, through the Switching part $SW_S$, through the Switching circuit SLS. Particularly, the switching parts $SW_S$ to $SW_N$ are rectifying element, so that the current $I_{XW}$ is applied from only the selected word driver $WD_S$ with the highest input (base) voltage of the word drivers $WD_S$ to $WD_N$. When a current $I_{XW}$ flows during the read operation, the selection signal $V_{XS}$ is lower than that during the write operation by the amount of $R_X I_{XW}$. In other words, an amplitude $\Delta R$ of the potentials of the selected and non-selected word line during the read operation is smaller than $\Delta W$ during the write operation by $R_X I_{XW}$. Therefore, the amplitude $\Delta R$ during the read operation is set to the minimum value, the switching time of the selected word line in the read operation becomes short as compared with the conventional time as indicated by $\Delta t$ of FIG. 7. This means the shortening of the access time of the RAM is shortened.

The structure shown in FIG. 6 is the simplest and consumes less power because first, the voltage level of only one selected word line among plurality of word lines is changed, and second, the common current source $I_{XW}$ is provided and thereby the current $I_{XW}$ is supplied to only the one selected word line.

Figure 8:
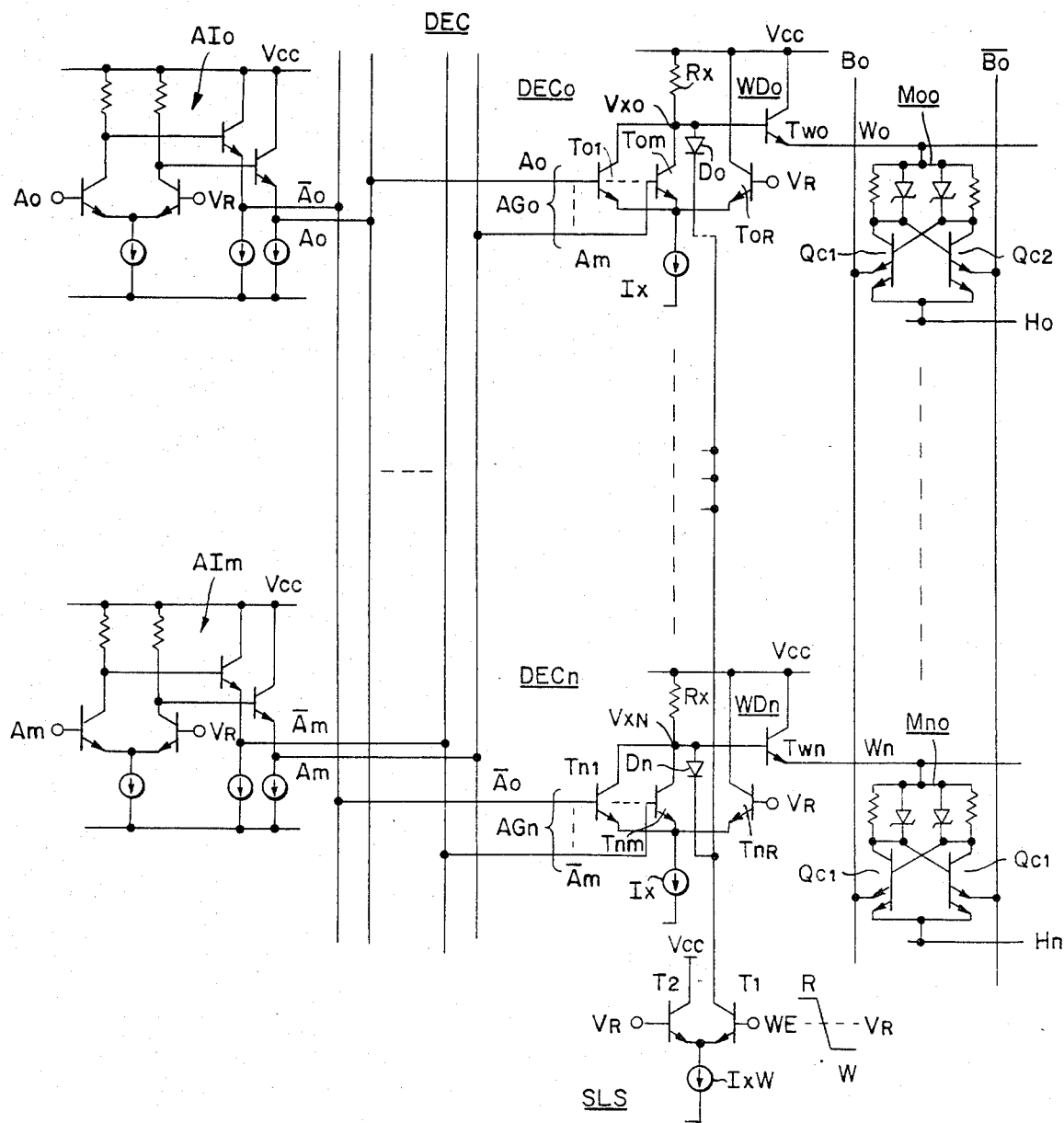
FIG. 8 is a schematic diagram indicating the 1st embodiment of the present invention.

FIG. 8 is a schematic diagram of the 1st embodiment of the present invention being adapted to a logical decoder.

The decoder $DEC_S$ generates signals $A_0$ to $A_m$ and the inverted signals $\overline{A}_0$ to $\overline{A}_m$ from the address input $A_0$ to $A_m$ with the address inverters $AI_0$ to $AI_m$ are of the current switch structure. The desired m-bit pair among 2m bits in total of $A_0$ to $A_m$, $\overline{A}_0$ to $\overline{A}_m$ can be combined up to $n+1$ ($n+1=2^{m+1}$) from $(A_0, A_1, \ldots, A_m)$ to $(\overline{A}_0, \overline{A}_1, \ldots \overline{A}_m)$. Thus, the $n+1$ decoders $DEC_0$ to $DEC_n$ are provided, and address signal groups $AG_0$ to $AG_n$ are provided to the decoders $DEC_0$ $DEC_n$ respectively. The decoder $DEC_0$ includes the NOR gate composed of the transistors $T_{01}$ to $T_{0m}$ receiving the inputs of $A_0$ to $A_m$, load resistance $R_X$, and transistor $T_{OR}$ which forms the current switch together with the NOR gate and the constant current source $I_x$. The selection signal voltage $V_{X0}$ obtained from the decoder $DEC_0$ is applied to the input terminal (base) of the word driver $WD_0$. The other word drivers and decoders are also structured in the same way. Operations are performed as well known. When all of $A_0$ to $A_m$ signals are a L level, the transistors $T_{01}$ to $T_{0m}$ are OFF. As a result, $V_X$ becomes equal to $V_{CC}$ and the word line $W_0$ is the selection level. On the contrary, when any one of $A_0$ to $A_m$ is H, the current $I_X$ flows into the load resistance $R_X$, $V_X$ becomes equal to $V_{CC} - R_X I_X$ and the word line $W_0$ is the non-selection level.

In this embodiment, the diodes $D_0$ to $D_n$ are used as the rectifying element of the switching part ($SW_S$ of FIG. 6) in order to change the potential of the word lines in the read and write operations, and moreover a single selected word line level switching circuit SLS consisting of the transistors $T_1$ and $T_2$, and the constant current source $I_{XW}$ are provided in common to each decoder. The first and second transistors $T_1$, $T_2$ are emitter-connected and the common emitter side is connected to the current source $I_{XW}$. The reference voltage $V_R$ is applied to the base of the 2nd transistor $T_2$ and its collector is connected to an adequate voltage ($V_{CC}$, for example). On the other hand, the write control signal WE is applied to the base of the first transistor and its collector to the cathode of diodes $D_0$ to $D_n$. The anodes of diodes $D_0$ to $D_n$ are connected to the point $V_X$ of the word drivers $WD_0$ to $WD_n$ respectively (in FIG. 8, $V_X$ is indicated as $V_{XS}$ while selected, $V_X$ as $V_{XN}$ while not selected).

The operation of decoders and word drivers thus structured is explained below.

When the word line $W_0$ (FIG. 8) is selected, all signals $A_0$ to $A_m$ of the address signal group $AG_0$ are a L level, while at least any one bit of the each other address signal group (represented by $AG_n$) is a H level. Therefore, at the decoder $DEC_n$ and word driver $WD_n$, at least one of transistors $T_{n1}$ to $T_{nm}$ is ON and the current $I_X$ flows through the load resistance $R_X$. Thereby, the potential of the selection signal $V_{XN}$, is equal to $(V_{CC}-R_XI_X)$. As a result, the non-selected word line $W_n$ is kept at the lowest non-selection level. On the other hand, at the decoder $DEC_0$ and word driver $WD_0$, all of the transistors $T_{01}$ to $T_{0m}$ are OFF. Therefore, the level of $V_{X0}$ is determined by the factor other than $I_X$. Namely, since the write control signal WE is a H during the read operation, the transistor $T_1$ is ON. Resultingly, the current $I_{XW}$ flows on along the route, $V_{CC} \rightarrow R_X \rightarrow V_{X0} \rightarrow D_0 \rightarrow T_1$, and $V_{XS}$ is equal to $(V_{CC}-R_XI_{XW})$ (intermediate value). Since the rectifying elements, diodes $D_0$ to $D_n$ form the current switch, the $I_{XW}$ flows from the highest point of the $V_{X0}$ to $V_{XN}$. Therefore, when $I_X > I_{XW}$, $V_{XS}$ is larger than $V_{XN}(V_{XS} > V_{XN})$. Thus, the $I_{XW}$ flows only through the load resistance $R_X$. While in the write operation mode (W), WE=L. Therefore, the transistor $T_1$ is OFF and the current $I_{XW}$ flows through transistor $T_2$. Namely, the current $I_{XW}$ does not flow through any load resistance $R_X$. For this reason, neither $I_X$ nor $I_{XW}$ flow through the word driver $WD_0$ and resultingly $V_{XS}$ becomes equal to $V_{CC}$ (maximum value).

Figure 4:
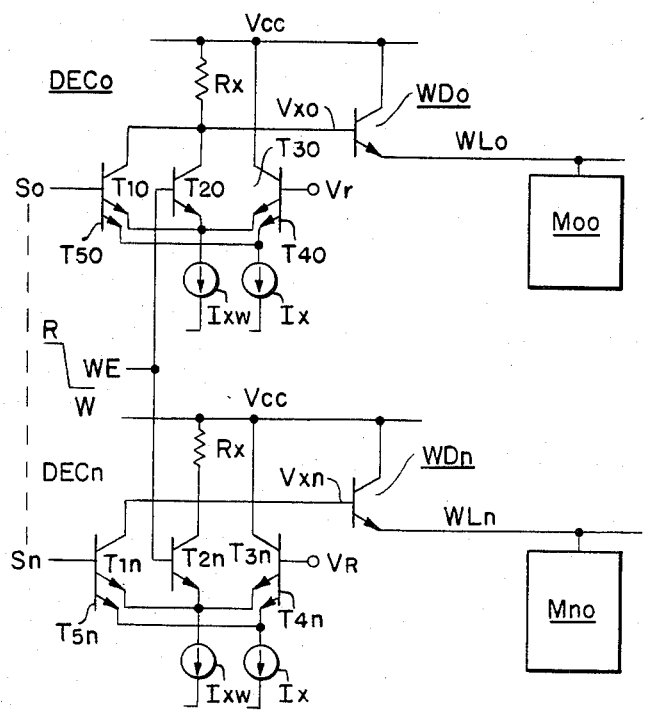
FIG. 4 is a schematic diagram of an example of a conventional memory cell array drive circuit.
Figure 5:
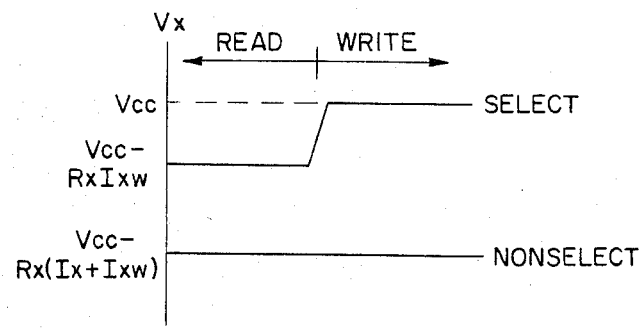
FIG. 5 is a graph of the operating voltage waveforms at terminals of the circuit in FIG. 4.

Variation of the potential of the word lines thus obtained shows the characteristic similar to the conventional one shown in FIG. 5. But this embodiment forms the current switch with the rectifying, diodes $D_0$ to $D_n$ and uses in common for all word drivers, the selected word line level switching circuit SLS comprising the current source $I_{XW}$ and transistors $T_1$, $T_2$, thus drastically simplifying the circuit structure as compared with the conventional structure shown in FIG. 4 and providing high density integration. Moreover, this embodiment does not use the multi-emitter type transistor and therefore has simplified the circuit pattern and uses less current, thus consuming less power.

Figure 9A:
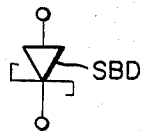
FIGS. 9A-9C are schematic diagrams of embodiments of change-over circuits of the present invention.
Figure 9B:
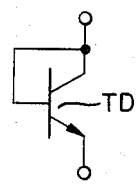
Figure 9C:
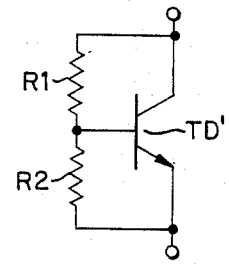

In the embodiment of FIG. 8, the diodes $D_0$ to $D_n$ are used as the rectifying element of the switching parts (SWs of FIG. 6), the diodes $D_0$ to $D_n$ are used. However, any rectifying element can be used. For example, the Schottky barrier diode SBD as shown in FIG. 9A, transistor TD where the base and collector are terminated as shown in FIG. 9B or the rectifying circuit consisting of the resistances $R_1$, $R_2$ and transistor TD' can also be used.

Figure 10:
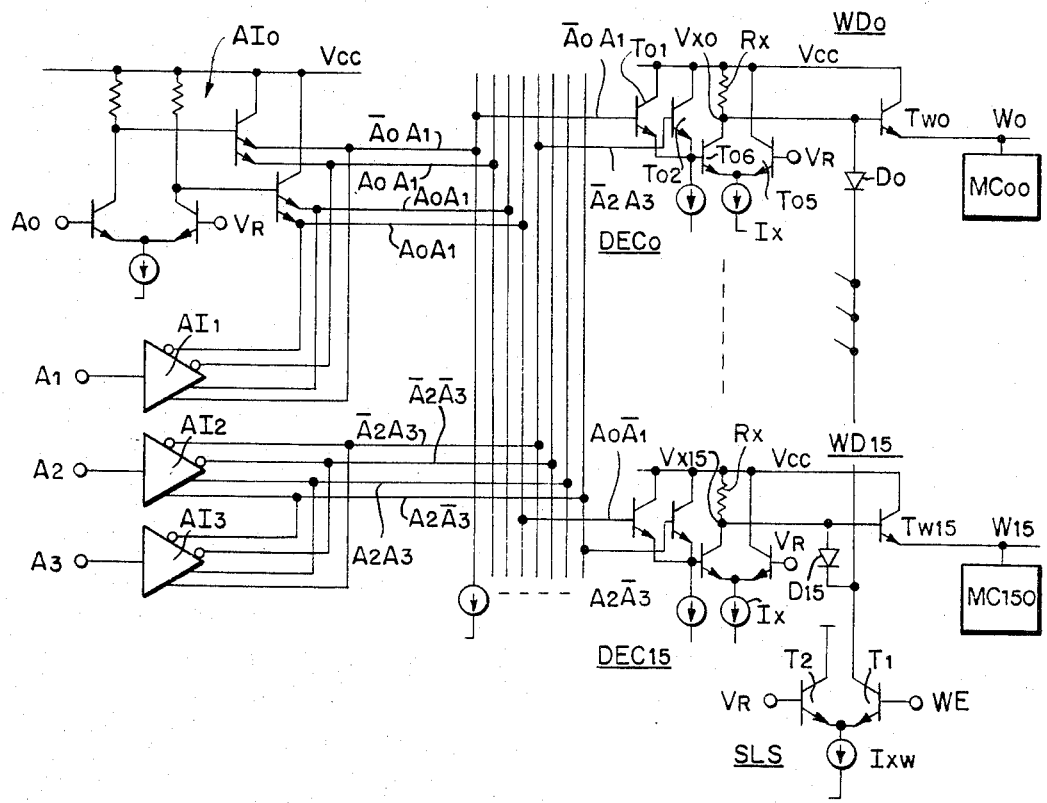
FIG. 10 is a schematic diagram of the 2nd embodiment of the present invention.

FIG. 10 is a schematic diagram of the 2nd embodiment of the present invention. The present invention is adapted to a logical decoder of a type different from FIG. 8.

The operation of this logical type decoder is as follow. First, eight 2-bit combinations $\overline{A_0}A_1$, $\overline{A_0}\overline{A_1}$, ... $A_2\overline{A_3}$ are generated by combining the non-inverted and inverted outputs of the address inverters $AI_0$ to $AI_3$. $\overline{A_0}A_1$ is a L level when both $\overline{A_0}$ and $A_1$ are L, but is a H level when either is H. This is also true for $\overline{A_0}A_1$ to $A_2\overline{A_3}$. The desired two pairs of these are used as the input of the decoders $DEC_0$ to $DEC_{15}$. The decoder $DEC_0$ (similar to the other decoders) is composed of the transistors $T_{01}$, $T_{02}$ which are controlled by the inputs $\overline{A_0}A_1$, $\overline{A_2}A_3$, load resistance $R_X$, transistors $T_{05}$, $T_{06}$ forming the current switch and the current source $I_X$. The word driver $WD_0$ is composed of the transistor $T_{W0}$. Operation is the same as FIG. 8. When both $\overline{A_0}A_1$ and $\overline{A_2}A_3$ are a L level, transistors $T_{01}$, $T_{02}$ are OFF, the transistor $T_{06}$ also is OFF, resulting in $V_X = V_{CC}$. Thus, the word line $W_0$ rises to the selection level. Meanwhile, when at least one of $\overline{A_0}A_1$, $\overline{A_2}A_3$ is H level, the transistor $T_{06}$ is ON, resulting in $V_X = V_{CC} - R_XI_X$. Thus, the word line $W_0$ is in the non-selection level.

As in the case of FIG. 8, in this embodiment, the diodes $D_0$ to $D_{15}$, functioning as the switching parts SWs of FIG. 6, are provided at the input terminals $V_{X0}$ to $V_{X15}$ (here the selection signal is applied) of the transistors $T_{W0}$ to $T_{W15}$ of the word drivers $WD_0$ to $WD_{15}$. These diodes are also connected in common to a single selected word line level switching circuit SLS. The operation is the same as FIG. 8 and therefore explanation is omitted here.

Figure 11:
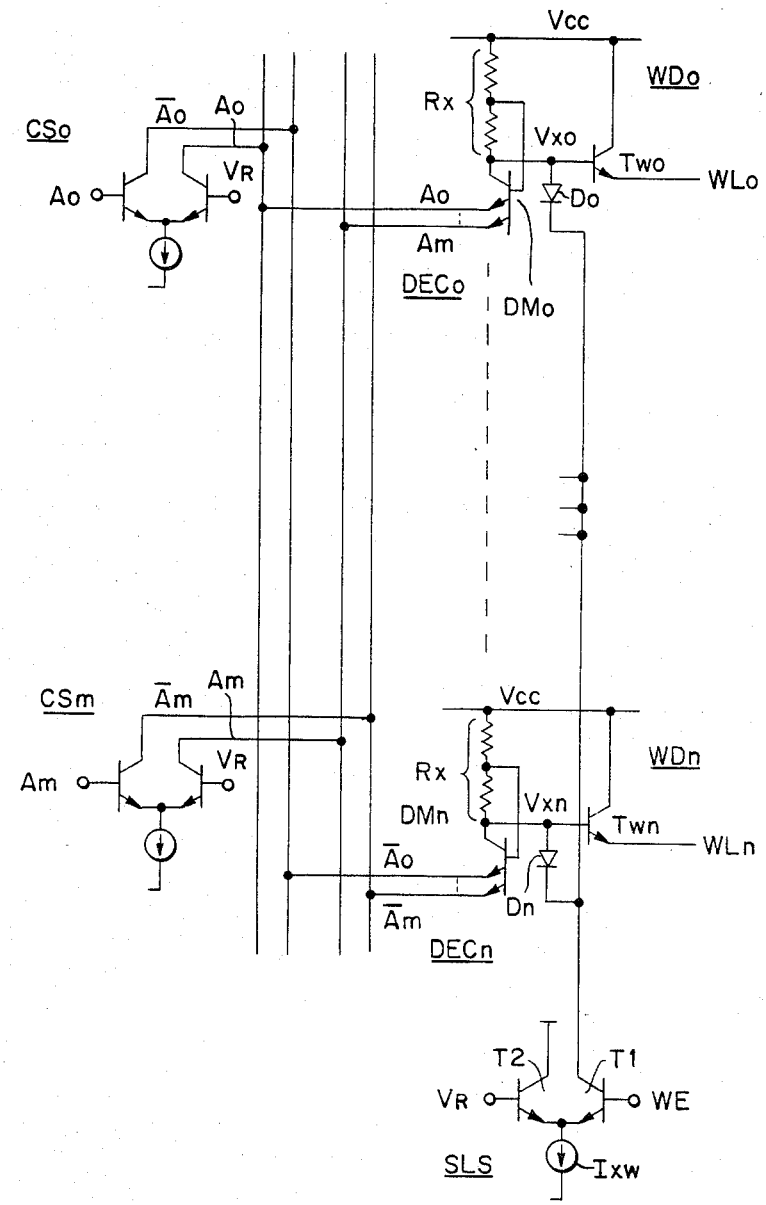
FIG. 11 is a schematic diagram of the 3rd embodiment of the present invention.

FIG. 11 is the third embodiment of the present invention employing a general diode matrix type decoder. This decoder has the current switches $CS_0$ to $CS_m$ of which one transistor receives the address signals $A_0$, $A_1$ ..., while the other transistor receives the reference voltage $V_R$. Thereby, the signals $A_0$ to $A_n$ and inverted $\overline{A_0}$ to $\overline{A_m}$ are obtained. Thereafter, the desired m+1 signals among the 2(m+1) signals $A_0$ to $\overline{A_m}$ are selected and connected to the m+1 emitters of the multi-emitter transistor of diode matrixes $DM_0$ to $DM_n$ of the decoders $DEC_0$ to $DEC_n$. In the selected diode matrix among the diode matricies $DM_0$ to $DM_n$, all emitters are at the H level and the multiemitter transistor is OFF. Thereby, the selected input terminal $V_{X0}$ to $V_{Xn}$ of the word drivers $WD_0$ to $WD_n$ is any H level and the relevant word line $W_0$ to $W_n$ is set to the high potential selection level. If any transistor of $DM_1$ to $DM_n$ is ON, a voltage drop across resistance $R_X$ occurs and the selection signal $V_{X0}$ to $V_{Xn}$ becomes a L level. As a result, corresponding word line is set to the low potential non-selection level.

In this embodiment, the diodes $D_0$ to $D_n$ are provided as the switching parts SWs of FIG. 6 to the input terminal (to which the selection signals $V_{X0}$ to $V_{Xn}$ are applied) of the driver transistors $T_{W0}$ to $T_{Wn}$ of the word drivers $WD_0$ to $WD_n$ as in the case of FIG. 8. These diodes are also connected in common to the one selected word line level switching circuit SLS. The operation is the same as that of FIG. 8 and therefore explanation is omitted here.

In above embodiment, the selected word line level switching circuit SLS comprises the current switch consisting of the transistors $T_1$, $T_2$ and the constant current source $I_{XW}$, but this circuit can also be attained by the other circuit.

Figure 12:
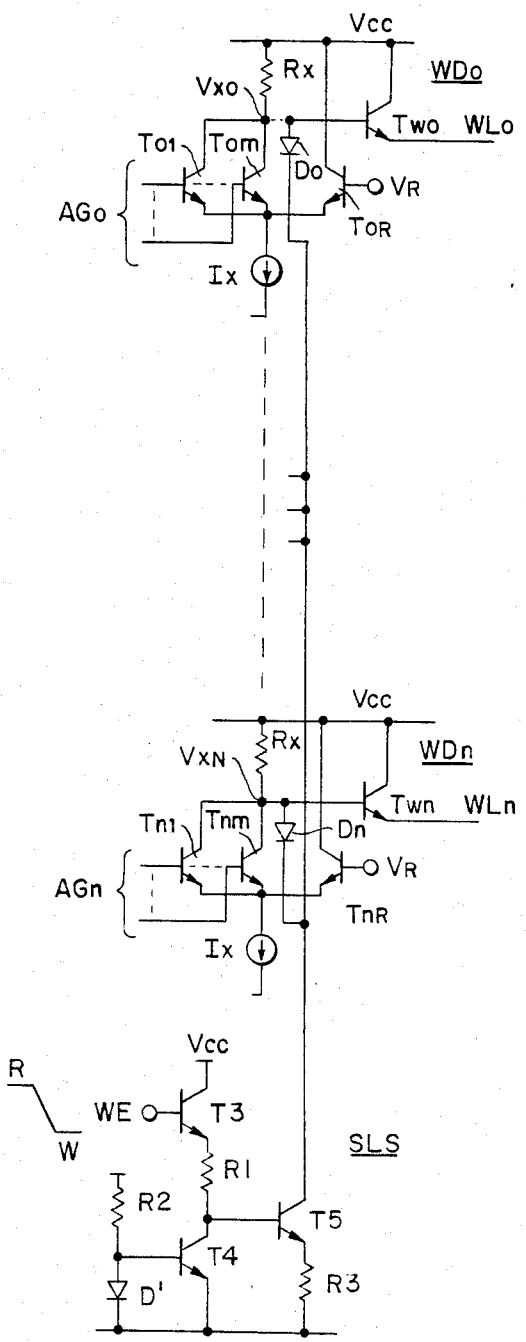
FIG. 12 is a schematic diagram of the 4th embodiment of the present invention.

FIG. 12 shows the fourth embodiment of the present invention adapted to the logical decoder as in the case of FIG. 8. This circuit provides the selected word line level switching circuit SLS consisting of the switching part composed of the diodes $D_0$ to $D^1$, transistors $T_3$, $T_4$, $T_5$ and resistors $R_1$, $R_2$ and $R_3$. Respective elements are connected as indicated in the figure. The collector of transistor $T_3$ and resistor $R_2$ are connected to adequate voltage ($V_{CC}$, for example), while the diode $D'$, emitter of transistor $T_4$ and resistor $R_3$ are connected to a low voltage. The base of transistor $T_3$ is connected to the write control signal WE.

In such structure, since the write control signal WE is a H level during the read operation (R), the transistor $T_3$ is ON and the transistor $T_5$ also becomes ON.

Thereby, a current flows through the route, $V_{CC} \rightarrow R_X \rightarrow V_{XS} \rightarrow D_0 \rightarrow T_5 \rightarrow R_3$, setting $V_{XS}$ to an intermediate value. On the other hand, in the write operation (W), the signal WE is a L level and therefore the transistors $T_3$, $T_5$ are OFF. Thus signal does not flow through any of the diodes $D_0 \ldots D_n$, thus setting $V_{XS}$ to $V_{CC}$ (maximum value). Of course, this embodiment can be adopted to the decoder of diode matrix type.

Figure 13:
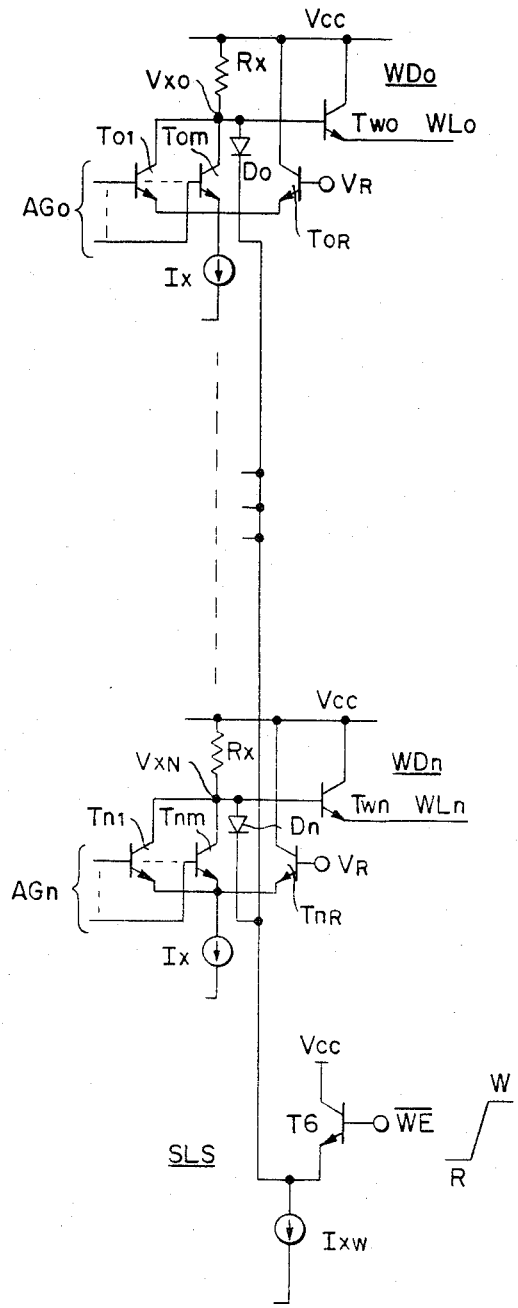
FIG. 13 is a schematic diagram of the 5th embodiment of the present invention.

FIG. 13 is the fifth embodiment of the present invention, adapted to the logical decoder. In this embodiment, the switching parts, diodes $D_0$ to $D_n$ and the selected word line level switching circuit SLS consisting of the transistor $T_6$ and constant current source $I_{XW}$ are provided. Connections are as indicated in the figure. The base of transistor $T_6$ is connected to the inverted level of the write control signal WE, namely $\overline{WE}$. During the read operation (R), $\overline{WE}$ is a L level and the transistor $T_6$ turns OFF and thereby the current $I_{XW}$ flows from the highest voltage of the selection signal voltages $V_{X0}$ to $V_{XN}$. Meanwhile, during the write operation (W), WE becomes sufficient H level and the current $I_{XW}$ flows into the transistor $T_6$ in the ON state. Of course, this embodiment can also be adopted to the diode matrix type decoder.

As explained previously, the present invention comprises a circuit which changes the potential of the word line for the write and read operations, particularly the driver circuit of the memory cell array with a simple circuit structure, which makes realizing a high speed read and on accurate write operation by making the selected word line potential higher during the write operation than that during the read operation, while the potential of the non-selected word line is kept at a constant value during the read and write operations. Therefore, the reduction in number of elements makes possible the higher integration density or simplification of the circuit pattern and moreover reduction in the current source brings about less power consumption. This is the outstanding advantage of the present invention.

What is claimed is:

1. A random access memory device, operatively connected to receive first and second power supply voltages from first and second power supply lines, respectively, for performing read and write operations, said device comprising:
    a plurality of memory cells arranged in a matrix form, each cell comprising a cross-connection transistor flip-flop circuit;
    a plurality of word lines each having a selected potential and a non-selected potential, said word lines respectively connected to corresponding ones of said memory cells;
    word drivers, each having selected and non-selected states, respectively operatively connected to said plurality of word lines, each having an input terminal for receiving selection signals, said word drivers providing said selected potential higher than said non-selected potential in accordance with the selection signals;
    word decoders, each having an output terminal respectively connected to an input terminal at a corresponding one of said word drivers, for supplying the selection signals to said word drivers, each of said word decoders including resistor means, operatively connected between the first power supply line and a respective output terminal, for generating the selection signals, having a higher or lower potential in accordance with said selected and non-selected states of said word drivers, respectively; and
    a selected word line level switching circuit, operatively connected to receive a read and write operation signal, and operatively connected to said plurality of word drivers, said selected word line level switching circuit comprising:
    a current source; and
    switching means, each of said switching means operatively connected to the input terminal of respective word drivers, and operatively connected to said current source, for selectively connecting said current source to said resistor means of only one of said selected word decoders during the read operation, and for making the selected potential of the selected word line during the read operation lower than the selected potential of the selected word line during the write operation.

2. A random access memory device as set forth in claim 1, wherein each of said word drivers comprise:
    a driver transistor having a collector operatively connected to receive the first power supply voltage, having an emitter connected to a corresponding one of said word lines and having a base corresponding to the input terminal for receiving a corresponding one of the selection signals.

3. A random access memory device as set forth in claim 2, wherein said current source of said selected word line level switching circuit has first and second current levels, the first current flows in said resistor means provided between the base of said driver transistor and the first power supply voltage in accordance with said selected word drivers in said selected state and said read operation, and the second current which is larger than the first current flows through said resistor means in accordance with said corresponding word drivers in said non-selected state.

4. A random access memory device as set forth in claim 1, wherein each of said switching means comprises a diode, having an anode connected to a corresponding one of said word drivers and having a cathode operatively connected in common to said current source.

5. A random access memory device as set forth in claim 1, wherein each of said switching means comprises a Schottky barrier diode, having an anode connected to a corresponding one of said word drivers and having a cathode operatively connected in common to said current source.

6. A random access memory device as set forth in claim 1, wherein each of said switching means comprises a transistor having a base, having a collector connected to said base and to a corresponding one of said word drivers, and having an emitter connected in common to said current source.

7. A random access memory device as set forth in claim 1, wherein each of said switching means comprises a transistor having a base, having a collector and having an emitter and which has at least two resistors operatively connected between said collector and said base and between said base and said emitter, respectively, said collectors of said respective transistors being connected to corresponding ones of said word drivers, and said emitters of each said transistor being operatively connected in common to said current source.

8. A random access memory device as set forth in claim 1, wherein said device is operatively connected to receive a reference voltage and a control signal, and wherein said selected word line level switching circuit further comprises:
first and second transistors each having a base, having a collector, and having an emitter connected in common to said current source, and said current source operatively connected between said emitter and the second power supply voltage, said collector of said first transistor is connected to receive the first power supply voltage, said base of said first transistor is operatively connected to receive the reference voltage, and said collector of said second transistor is operatively connected in common to each of said rectifying circuits, said base of said second transistor is operatively connected to receive the control signal, the control signal having a voltage higher than the reference voltage in response to the read operation and a voltage lower than the reference voltage in response to the write operation.

9. A random access memory device operatively connected to receive select signals, first and second power supply voltages from first and second power supply lines, respectively, and a control signal, for performing read and write operations, comprising:
a plurality of memory cells, each comprising a cross-connected transistor flip-flop circuit arranged in a matrix form;
a plurality of word lines, each having a selected potential and a non-selected potential, said word lines respectively, operatively connected to said memory cells;
word line driver means, respectively, operatively connected to said word lines and to said memory cells and having input terminals operatively connected to receive the select signals, for providing said selected potential and said non-selected potential of said word lines, said selected potential being higher than sad non-selective potential, and said word line driver means having a selected state and a non-selected state;
word decoder means having output terminals respectively, operatively connected to said input terminals of word line driver means, for providing the select signals to said word line driver means, each of said word decoder means including resistor means operatively connected between the first power supply line and respective output terminals, for generating the select signals, the select signals having a higher or lower potential in accordance with said selected and non-selected states of said word line driver means, respectively; and
selected word line level switching means, operatively connected to receive read or write operation signals and operatively connected to said word line driver means, for varying said higher potential of the select signals between first and second levels in accordance with the read operation and the write operation signals, said selected word line level switching means comprising:
a current source; and
switching means, operatively connected to said current source, and each respectively, operatively connected to the input terminals of said word line driver means, for selectively connecting said current source to said resistor means of only one of said selected word decoder means during the read operation, and for making the selected potential of said selected word line during the read operation lower than the selected potential of said selected word line during the write operation.

10. A random access memory device as set forth in claim 9, wherein each of said word line driver means comprises:
a driver transistor having a collector operatively connected to receive the first power supply voltage, an emitter operatively connected to a corresponding one of said word lines, and a base operatively connected to receive a corresponding one of the select signals.

11. A random access memory device as set forth in claim 9, wherein said switching means comprises a diode having an anode operatively connected to said base of said driver transistor, and a cathode operatively connected to said current source.

12. A random access memory device as set forth in claim 9, wherein said switching means comprises a Schottky barrier diode having anode operatively connected to said base of said driver transistor, and a cathode operatively connected to said current source.

13. A random access memory device as set forth in claim 9, wherein said switching means comprises a transistor having a base, having a collector operatively connected to said base and to said base of said driver transistor, and having an emitter operatively connected to said current source.

14. A random access memory device as set forth in claim 9, wherein said switching means comprises:
a transistor having a base, having a collector operatively connected to said base, and having an emitter operatively connected to said current source;
a first resistor operatively connected between said collector and said base of said transistor; and
a second resistor operatively connected between said base and said emitter of said transistor.

15. A random access memory device as set forth in claim 9, operatively connected to receive a reference voltage, wherein said selected word line level switching means further comprises first and second transistors each having a base, having a collector and having an emitter, said emitter of each of said first and second transistors operatively connected to said current source, said collector of said first transistor operatively connected to receive the first power supply voltage, said base of said first transistor operatively connected to receive the reference voltage, said collector of said second transistor operatively connected to said rectifying circuit and said base of said second transistor operatively connected to receive the control signal, wherein the control signal has a voltage higher than the reference voltage in response to the read operation and a voltage lower than the reference voltage in response to the write operation.

16. A random access memory device as set forth in claim 9, wherein said selected word line level switching means further comprises:
a first transistor having a base operatively connected to receive the control signal, having a collector operatively connected to receive the first power supply voltage and having an emitter;
a first resistor having a first terminal operatively connected to said emitter of said first transistor, and having a second terminal;
a second transistor having a collector operatively connected to said second terminal of said first resistor, having an emitter operatively connected to receive the second power supply voltage and having a base;

a second resistor having a first terminal operatively connected to receive the first power supply voltage and having a second terminal operatively connected to said base of said second transistor;

a rectifying circuit having a first terminal operatively connected to said base of said second transistor and having a second terminal operatively connected to receive the second power supply voltage;

a third transistor having a base operatively connected to said second terminal of said first resistor and said collector of said second transistor, having a collector operatively connected to said switching means, and having an emitter; and a third resistor having a first terminal operatively connected to said emitter of said third transistor and having a second terminal operatively connected to receive the second power supply voltage.

* * * * *

UNITED STATES PATENT AND TRADEMARK OFFICE
CERTIFICATE OF CORRECTION

PATENT NO. : 4,536,860
DATED : AUGUST 20, 1985
INVENTOR(S) : KAZUHIRO TOYODA ET AL.

It is certified that error appears in the above-identified patent and that said Letters Patent is hereby corrected as shown below:

Col. 1, line 18, "matrix" should be --matrix,--.

Col. 2, line 14, delete "is";
line 44, "the $\bar{V}_D$ below" should be --$\bar{V}_D$ below the--.

Col. 3, line 2, "turns" should be --turn--;
line 11, "=" (first occurrence) should be -- ~ --.

Col. 4, line 2, after "$T_{40}$" insert --, but not the load resistance $R_x$--;

line 47, delete "consumption";
line 52, delete "where";
line 66, delete ", the switching circuit";
line 67, after "operation" insert --, the switching circuit--.

Col. 5, line 9, "1" should be --1;--;
line 68, "element," should be --elements,--.

Col. 7, line 35, "rectifying," should be --rectifying--;
line 47, delete ", the diodes $D_0$ to $D_N$ are used";
line 59, "low." should be --lows.--.

UNITED STATES PATENT AND TRADEMARK OFFICE
CERTIFICATE OF CORRECTION

PATENT NO. : 4,536,860

DATED : AUGUST 20, 1985

INVENTOR(S) : KAZUHIRO TOYODA ET AL.

It is certified that error appears in the above-identified patent and that said Letters Patent is hereby corrected as shown below:

Col. 8, line 33, "any" should be --a--;
      line 37, after "result" insert --the--;
      line 58, "$D_0$ to $D^1$" should be --$D_0$ to $D_n$ and D'--;
      line 68, "becomes" should be --is--.
      line 38, "sad" should be --said--.
Col. 11, line 38, "selective" should be --selected--.

Signed and Sealed this

Thirty-first Day of December 1985

[SEAL]

Attest:

DONALD J. QUIGG

Attesting Officer     Commissioner of Patents and Trademarks